United States Patent
Kenmoku

(10) Patent No.: US 6,879,381 B2
(45) Date of Patent: Apr. 12, 2005

(54) EXPOSURE APPARATUS, CONTROL METHOD FOR THE SAME, AND DEVICE FABRICATING METHOD

(75) Inventor: Hiromi Kenmoku, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/227,384

(22) Filed: Aug. 26, 2002

(65) Prior Publication Data

US 2003/0042920 A1 Mar. 6, 2003

(30) Foreign Application Priority Data

Aug. 28, 2001 (JP) ..................................... 2001-257795

(51) Int. Cl.$^7$ ........................ G03B 27/52; G03B 27/42; G03B 27/68; G03B 27/32
(52) U.S. Cl. .......................... 355/55; 355/53; 355/52; 355/77
(58) Field of Search ............................. 355/55, 53, 52, 355/67, 77; 250/548; 356/399, 400, 401; 324/752

(56) References Cited

U.S. PATENT DOCUMENTS

| | | | |
|---|---|---|---|
| 6,078,380 A | * | 6/2000 | Taniguchi et al. ............ 355/52 |
| 6,281,966 B1 | | 8/2001 | Kenmoku ..................... 355/55 |
| 6,556,364 B2 | * | 4/2003 | Meehan et al. ............. 359/822 |
| 2002/0080338 A1 | * | 6/2002 | Taniguchi ..................... 355/67 |

FOREIGN PATENT DOCUMENTS

JP 2897345 3/1999

* cited by examiner

Primary Examiner—Peter B. Kim
(74) Attorney, Agent, or Firm—Fitzpatrick, Cella, Harper & Scinto

(57) ABSTRACT

An exposure apparatus has a projection optical system for projecting a pattern onto a substrate. The projection optical system includes a correction lens for correcting optical characteristics thereof. The apparatus includes a driving unit which drives the correction lens to a target position, a monitor unit which monitors a positional displacement of the correction lens from the target position during exposure of the substrate, and a control unit which controls a process during or after the exposure on the basis of a monitoring result obtained by the monitor unit.

8 Claims, 6 Drawing Sheets

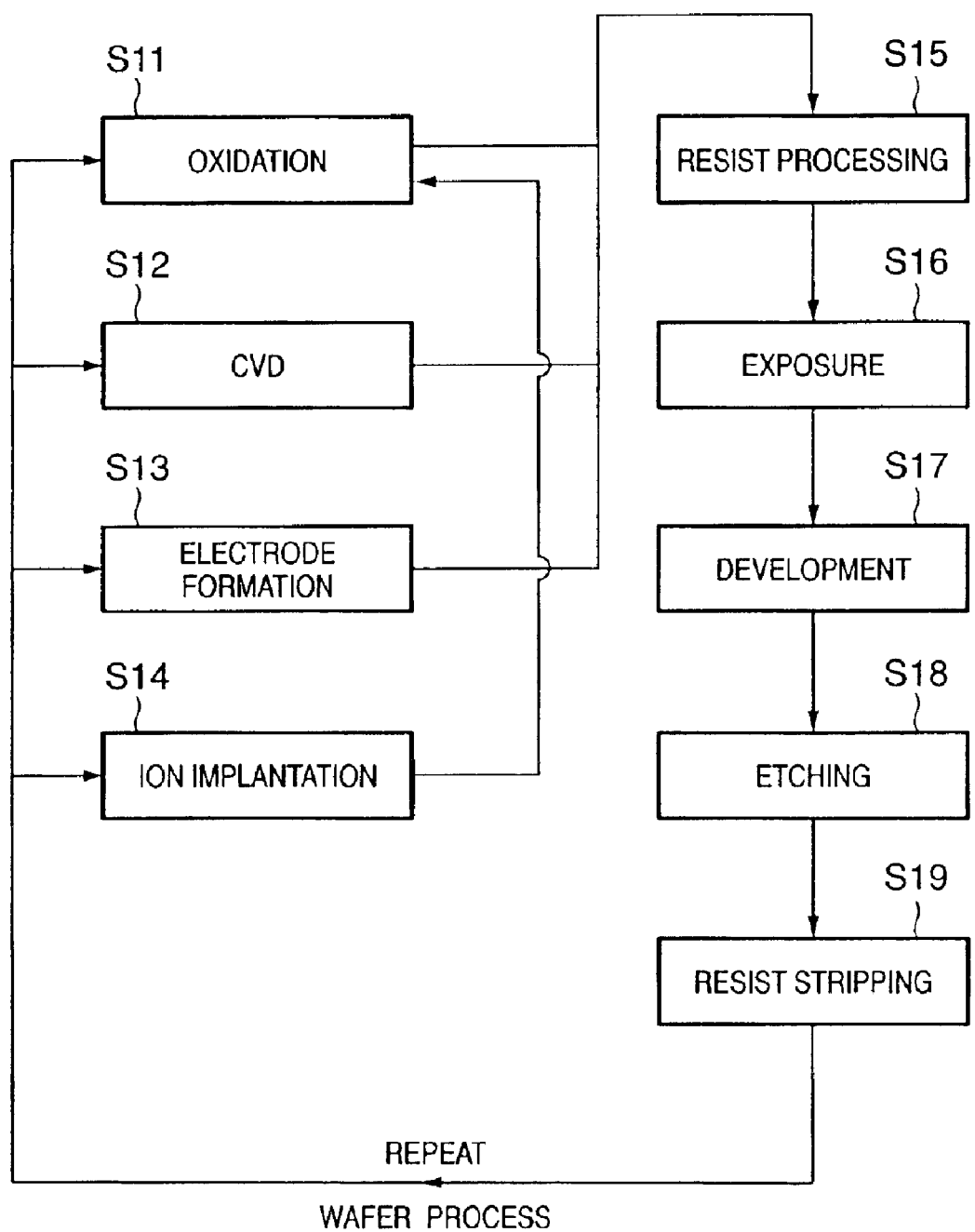

EXPOSURE APPARATUS, CONTROL METHOD FOR THE SAME, AND DEVICE FABRICATING METHOD

FIELD OF THE INVENTION

The present invention relates to an exposure apparatus, a control method for the same, and a device fabricating method.

BACKGROUND OF THE INVENTION

In a fabrication process for a semiconductor element such as an LSI or VLSI formed with an ultra-micropattern, a reduction projection exposure apparatus has been used which prints a circuit pattern formed on a master such as a reticle onto a substrate coated with a photosensitive agent (resist) by reducing and projecting the circuit pattern. Conventionally, further micropatterning is required to increase the packing density of circuit elements. With this background, a resist process has been developed and a projection exposure apparatus has been improved to cope with micropatterning.

Means for improving the projection exposure apparatus to cope with micropatterning includes improvement in alignment precision with which the pattern is correctly overlaid. Factors that largely influence the alignment precision include a magnification error or distortion error of a projection optical system.

A magnification error or distortion error appears as a difference between a desired grid point and the grid point of a projection pattern. Such magnification and distortion errors of the projection optical system are corrected by adjustment in the manufacturing process of the projection optical system and adjustment of the exposure apparatus in installation. These errors are known to change in accordance with the ambient atmosphere, particularly the atmospheric pressure and temperature. The projection optical system absorbs an exposure energy during wafer exposure. This changes optical elements (e.g., a refractive index and shape), thus changing any magnification or distortion errors.

As a method of correcting magnification and distortion errors caused by a change in atmospheric pressure or temperature, light absorption, and the like, the present applicant has proposed a method of arranging a plurality of correction lenses, which are movable in the direction of an optical axis, in a projection optical system, and changing the positions of the correction lenses, and a method of changing the wavelength of exposure light (Japanese Patent No. 2,897,345).

While measures for micropatterning have been sought, a further increase in throughput of the exposure apparatus has been attempted to reduce the fabrication cost of a semiconductor element. For example, an exposure time per shot may be shortened by increasing the output of the exposure light source. Also, the number of elements per shot may be increased by enlarging the exposure area.

In recent years, in order to cope with an increase in chip size of the semiconductor element, a shift is taking place from a step & repeat, so-called stepper, which sequentially prints a mask pattern while moving the wafer step by step, to a step & scan exposure apparatus, which scans and exposes while synchronizing the mask and wafer to each other and with which exposure sequentially moves on to the next shot when exposure of one shot is ended.

The step & scan exposure apparatus has a characteristic feature in that, as its exposure field has a slit-like shape, its exposure area can be enlarged without increasing the size of the projection optical system.

According to the step & scan exposure apparatus described above, when step movement is to be performed before exposure of each shot region in order to print a mask pattern onto a corresponding shot region on the wafer, the correction lens of the projection optical system is moved in the direction of the optical axis in accordance with a change amount of the atmospheric pressure, temperature, and light absorption, so magnification and distortion errors of the projection optical system are corrected. At this time, when the difference between the target position and current position of the correction lens falls within a predetermined range for a predetermined period of time or more, it is determined that positioning is complete, and exposure is performed immediately after this.

As the NA of the projection optical system increases, the output of the light source increases, or a switching mechanism for performing various types of illumination modes is loaded in accordance with employment of a modified illumination method that achieves high resolution by performing illumination while controlling the distribution of secondary light sources in various manners, the illumination optical system tends to increase in size and weight. This degrades the anti-vibration characteristics of the exposure apparatus.

Degradation in anti-vibration characteristics during exposure is apparent particularly when the step & scan exposure apparatus described above which performs scanning and exposure is employed. Assume that exposure is performed with a positional displacement of the correction lens of the projection optical system being caused by the operation of other portions of the exposure apparatus during exposure, or by a disturbance such as an external vibration, that is, in the presence of a projection magnification error and distortion error. Then, a device that does not have a necessary alignment precision is undesirably forwarded to the next step (developing step or the like).

So far, a description has been made of the magnification and distortion errors of the projection optical system. Other than these errors, for example, a focus error or curvature of field of the projection optical system is preferably considered.

SUMMARY OF THE INVENTION

The present invention has been made in view of the above background, and has as its one object to provide an apparatus and method with which, when the optical characteristics of a projection optical system during exposure have changed to an unwanted state due to disturbance or the like, this change can be coped with.

According to the first aspect of the present invention, there is provided an exposure apparatus having a projection optical system for projecting a pattern onto a substrate, characterized by comprising a monitor unit for monitoring optical characteristics of the projection optical system during exposure of the substrate, and a control unit for controlling a process after the exposure on the basis of a monitoring result obtained by the monitor unit.

According to a preferred embodiment of the present invention, the control unit preferably produces an alarm, when the optical characteristics of the projection optical system during exposure of the substrate are not within an allowable range, by utilizing a unit such as a display or loudspeaker.

According to a preferred embodiment of the present invention, the control unit preferably stops operation concerning exposure when the optical characteristics of the projection optical system during exposure of the substrate are not within an allowable range.

According to a preferred embodiment of the present invention, the projection optical system preferably includes a correction lens for correcting the optical characteristics thereof, and the monitor unit preferably monitors a control state of the correction lens during exposure of the substrate.

According to a preferred embodiment of the present invention, the exposure apparatus preferably further comprises a driving unit for driving the correction lens to a target position before and during exposure of the substrate.

According to a preferred embodiment of the present invention, the monitor unit preferably monitors a positional displacement of the correction lens from the target position during exposure of the substrate, and the control unit preferably controls a process after the exposure on the basis of whether or not the positional displacement of the correction lens during exposure of the substrate from the target position exceeds an allowable range.

According to a preferred embodiment of the present invention, the optical characteristics as a monitoring target by the monitor unit are related to at least one of, e.g., a projection magnification, distortion, focus, and field of curvature of the projection optical system directly or indirectly.

According to the second aspect of the present invention, there is provided a control method for an exposure apparatus having a projection optical system for projecting a pattern onto a substrate, characterized by comprising the steps of monitoring optical characteristics of the projection optical system during exposure of the substrate, and controlling a process after the exposure on the basis of a monitoring result during the monitoring step.

According to a preferred embodiment of the present invention, the step of controlling preferably includes producing an alarm when the optical characteristics of the projection optical system during exposure of the substrate are not within an allowable range.

According to a preferred embodiment of the present invention, the step of controlling preferably includes stopping operation concerning exposure when the optical characteristics of the projection optical system during exposure of the substrate are not within an allowable range.

According to a preferred embodiment of the present invention, the projection optical system preferably includes a correction lens for correcting the optical characteristics thereof, and the step of monitoring preferably includes monitoring a control state of the correction lens during exposure of the substrate.

According to a preferred embodiment of the present invention, the control method preferably further comprises the step of driving the correction lens to a target position before and during exposure of the substrate.

According to a preferred embodiment of the present invention, the step of monitoring preferably includes monitoring a positional displacement of the correction lens from the target position during exposure of the substrate, and the step of controlling preferably includes controlling a process after the exposure on the basis of whether or not the positional displacement of the correction lens during exposure of the substrate from the target position exceeds an allowable range.

According to a preferred embodiment of the present invention, the optical characteristics as a monitoring target of the monitoring step are related to at least one of, e.g., a projection magnification, distortion, focus, and field of curvature of the projection optical system.

According to the third aspect of the present invention, there is provided a device fabricating method comprising the step of applying a photosensitive agent to a substrate, the exposing step of, by utilizing an exposure apparatus that has a projection optical system for projecting a pattern onto a substrate, printing the pattern onto the substrate coated with the photosensitive agent, and the step of developing the substrate printed with the pattern, the step of exposing including the step of monitoring optical characteristics of the projection optical system during exposure of the substrate, and the step of developing being performed for only a substrate for which a monitoring result obtained by the monitoring step does not indicate that pattern printing is abnormal.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a flow chart showing a detailed flow of the wafer process.

DETAILED DESCRIPTION OF THE PREFERRED EMBODIMENT

The preferred embodiment of the present invention will be described with reference to the accompanying drawings.

Figure 1:
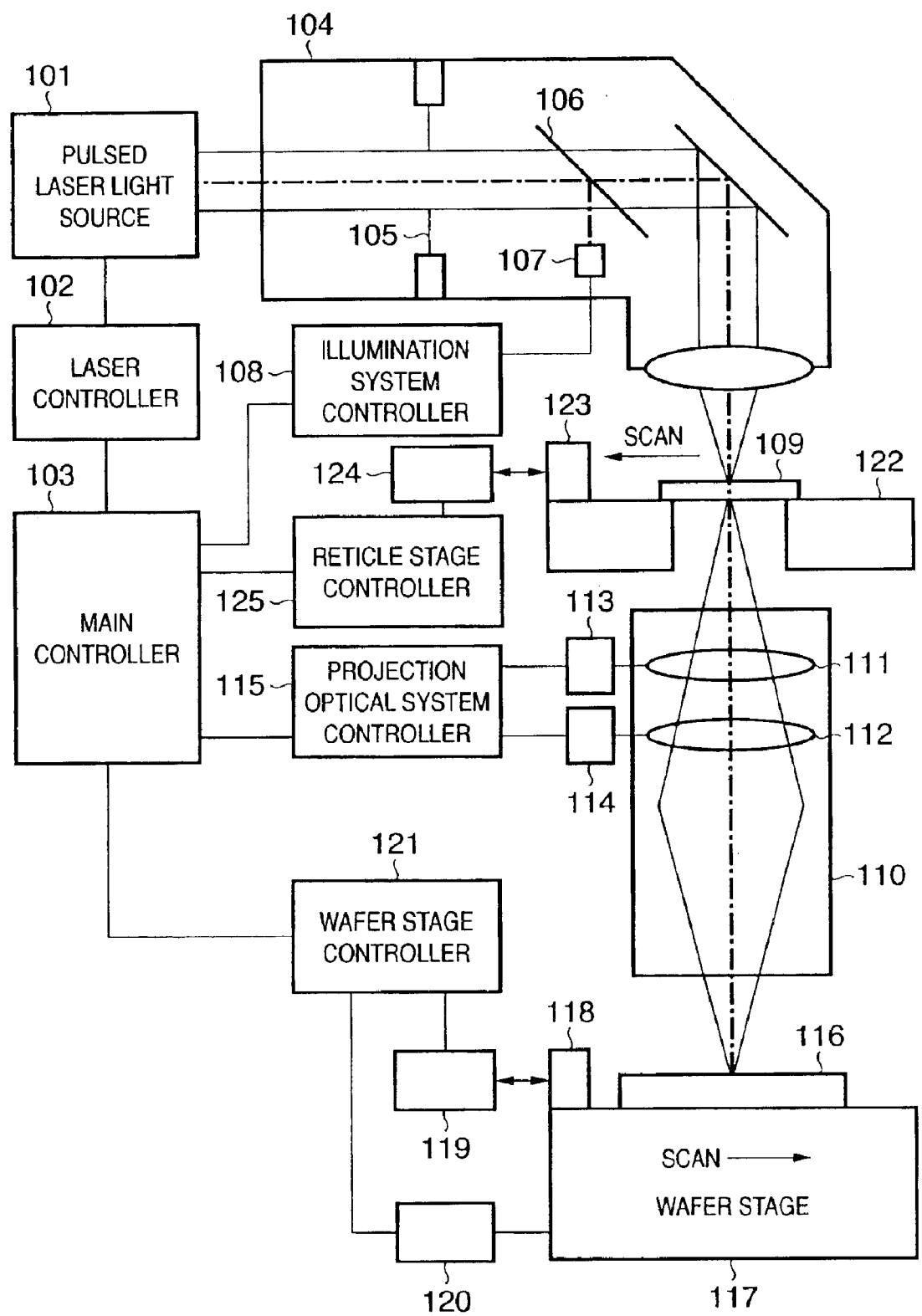
FIG. 1 is a view showing the schematic arrangement of a step & scan exposure apparatus according to a preferred embodiment of the present invention.

FIG. 1 is a view showing the schematic arrangement of a step & scan exposure apparatus according to a preferred embodiment of the present invention. A pulsed laser light source 101 uses, e.g., KrF gas, and generates a light beam with a wavelength of 248 nm or the like in a far ultra-violet range as exposure light. The pulsed laser light source 101 has a front mirror which forms a resonator, a band-narrowing module comprised of a diffraction grating, a prism, and the like, for narrowing the band of the exposure wavelength, a monitor module comprised of a spectroscope, a deflector, and the like, for monitoring the stability of the wavelength or the spectrum width, a shutter, and the like. The gas exchange operation, wavelength stabilizing control operation, control operation for a voltage to be discharged or applied, and the like, of the pulsed laser light source 101, are performed by a laser controller 102. Note that the pulsed laser light source 101 is not controlled only by the laser controller 102. Rather, higher control is performed by a main controller 103, which is connected to the laser controller 102 through an interface cable and which controls the entire exposure apparatus.

A beam emitted from the pulsed laser light source 101 is shaped into a predetermined beam shape through the beam shaping optical system (not shown) of an illumination optical system 104, and becomes incident on an optical integrator (not shown), to form a large number of secondary light sources for illuminating a mask (master) 109 with a uniform illuminance distribution. A half mirror 106 is inserted in the optical path of the illumination optical system 104. Part of the exposure light which illuminates the reticle 109 is reflected by the half mirror 106 and is extracted. A far-ultraviolet photosensor 107 is arranged on the optical path of the light reflected by the half mirror 106, and generates an output corresponding to the intensity of the exposure light (exposure energy). An output from the photosensor 107 is converted by an integration circuit (not shown), which integrates every pulsed beam emitted by the pulsed laser light source 101, into an exposure energy per pulse. The exposure energy is then input to the main controller 103, which controls the entire exposure apparatus, through an illumination system controller 108.

The circuit pattern of a semiconductor which is to be printed is formed on the reticle (master) 109, and is illuminated by the illumination optical system 104. A variable blind 105 includes a light-shielding plate arranged at a plane perpendicular to the optical axis. Thus, the illumination range of the circuit pattern surface of the reticle 109 can be arbitrarily set.

Figure 2:
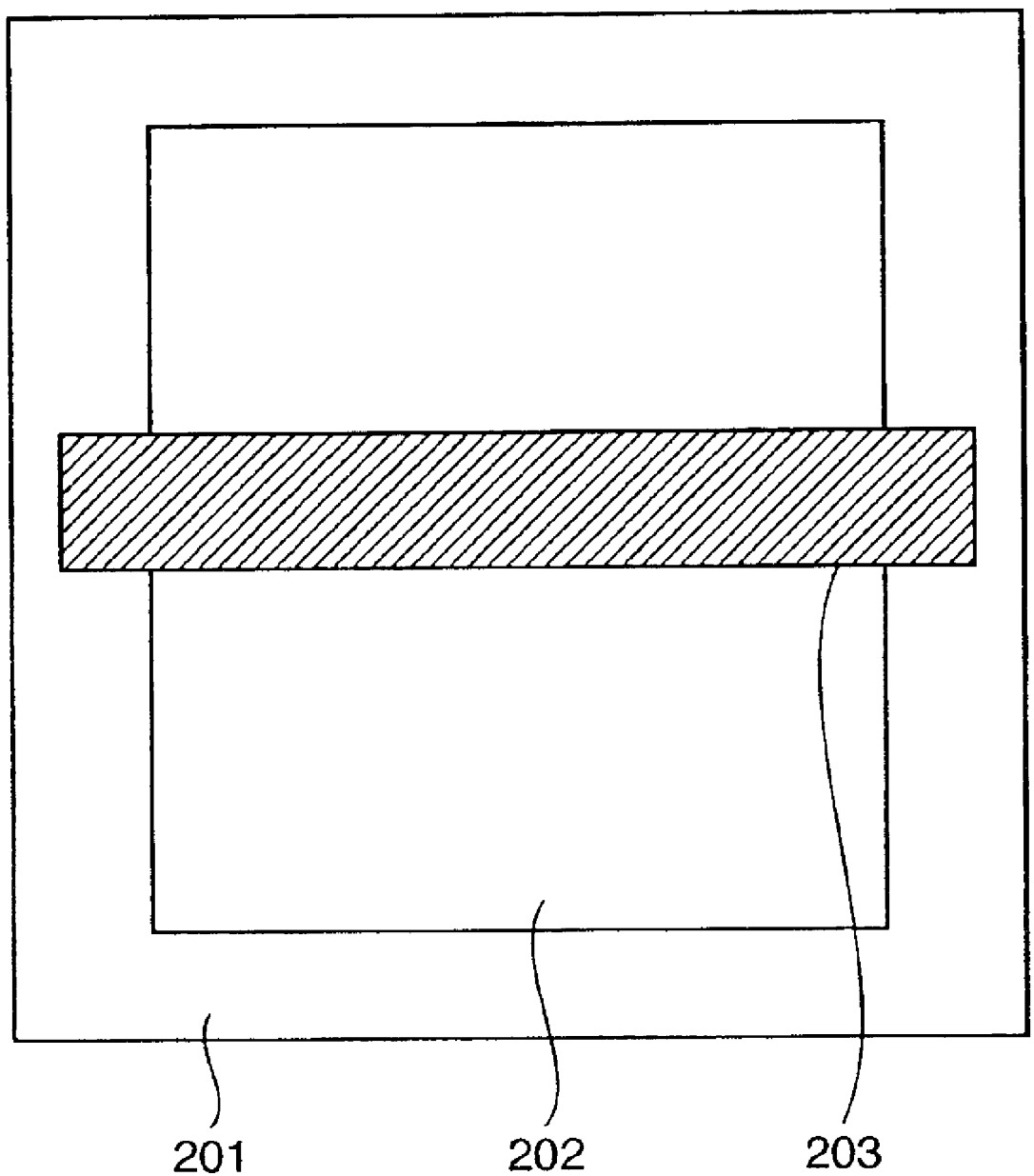
FIG. 2 is a view showing a reticle illuminated by an illumination optical system.

FIG. 2 shows the reticle 109 illuminated by the illumination optical system 104. Referring to FIG. 2, part of a circuit pattern 202 of the reticle 109 is slit-illuminated by a slit-like light beam 203, the sectional shape of which is regulated by the variable blind 105. That portion of the circuit pattern 202 which is slit-illuminated is reduced with a reduction magnification $\beta$ ($\beta$ is, e.g., ¼), and is projected onto a photo-resist coated wafer 116 through a projection optical system 110 shown in FIG. 1.

At this time, multi-pulse exposure by means of pulse emission from the pulsed laser light source 101 is repeated while scanning the reticle 109 and wafer 116 in opposite directions with respect to the projection optical system 110 and slit-like light beam 203 at the same speed ratio as the reduction magnification $\beta$ of the projection optical system 110, as shown in FIG. 1. Thus, the circuit pattern 202 on the entire surface of the reticle 109 can be transferred to one chip region or a plurality of chip regions on the wafer 116.

A reticle stage 122 is driven to scan by a driving system (not shown) in the direction of the arrow while holding the reticle 109. A movable mirror 123 is fixed to the mask stage 122. The position and speed of the reticle stage 122 are detected by a laser interferometer 124 by utilizing the movable mirror 123.

A wafer stage 117 is driven to scan by a stage driving system 120 in the direction of the arrow while holding the wafer 116. A movable mirror 118 is fixed to the wafer stage 117. The position and speed of the wafer stage 117 are detected by a laser interferometer 119 by utilizing the movable mirror 118.

The projection optical system 110 has correction lenses (lenses for correction) 111 and 112 for correcting magnification and distortion errors. The correction lenses 111 and 112 are driven in the direction of the optical axis of the projection optical system 110 by correction lens driving systems 113 and 114 each having an actuator utilizing a pneumatic pressure or piezoelectric element, to decrease magnification and distortion errors of a circuit pattern image to be transferred to the wafer 116. Regarding the moving amounts of the correction lenses 111 and 112, they can be controlled by detecting the displacement amounts of the correction lenses 111 and 112 or of the movable bodies (not shown) that hold them with displacement sensors (not shown) and feed-back controlling the correction lens driving systems 113 and 114 on the basis of outputs from the displacement sensors.

Figure 3:
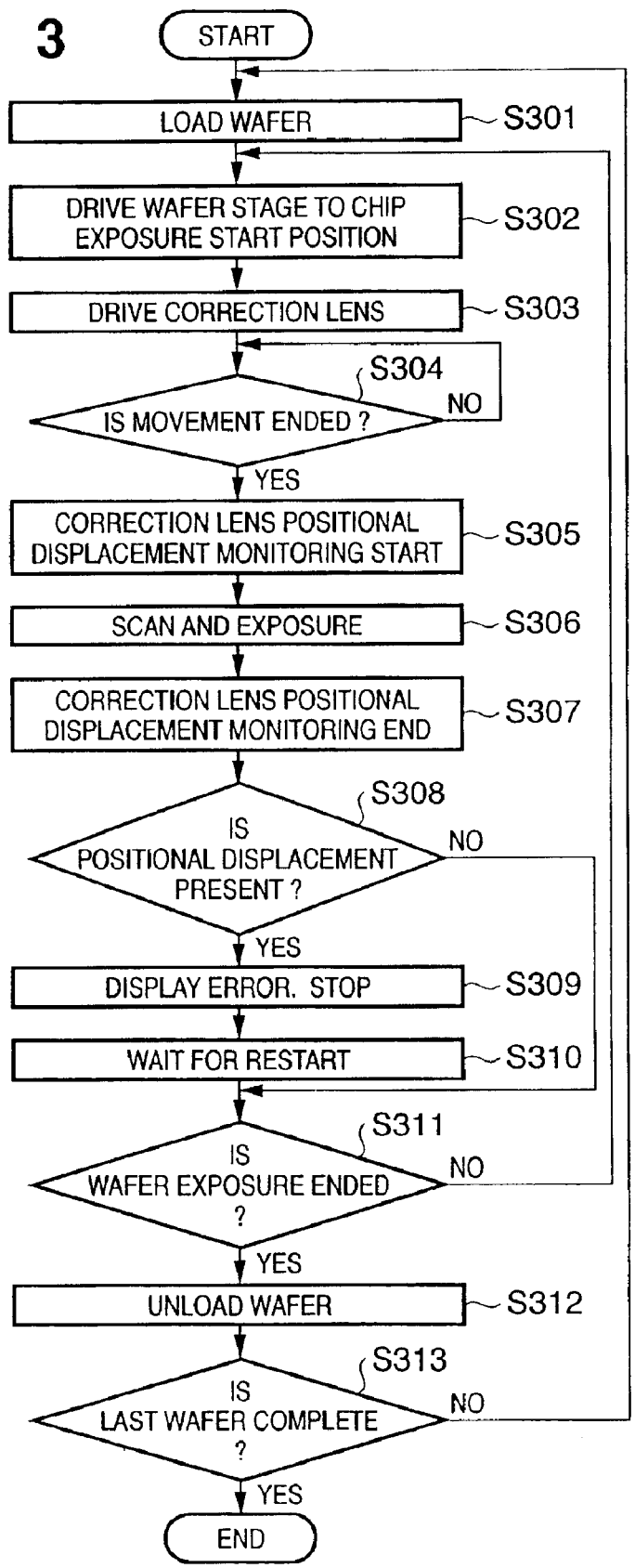
FIG. 3 is a flow chart showing exposure control performed by a main controller.

The position control and the monitor operation of the correction lenses 111 and 112 during exposure according to this embodiment will be described with reference to FIGS. 3 and 4. FIG. 3 is a flow chart showing exposure control performed by the main controller 103, and FIG. 4 is a flow chart showing control operation for the correction lenses 111 and 112 performed by a projection optical system controller 115.

In step S301, the wafer 116 is placed at a predetermined position on the wafer stage 117 by a transfer unit (not shown). In step S302, the main controller 103 moves the wafer stage 117 to an exposure start position for the first chip and prepares for the start of exposure.

In step S303, the main controller 103 estimates a projection magnification error and distortion error with the current atmospheric pressure, temperature, and light absorption amount (these quantities are measured by sensors (not shown)), and calculates the optimal positions (correction lens driving positions) of the correction lenses 111 and 112 for correcting these errors on the basis of the optical designed values of the correction lenses 111 and 112. The main controller 103 then sends a "correction lens driving" command accompanying the correction lens driving positions to the projection optical system controller 115. After this, in step S304, the main controller 103 waits for "movement end" communication from the projection optical system controller 115.

Figure 4:
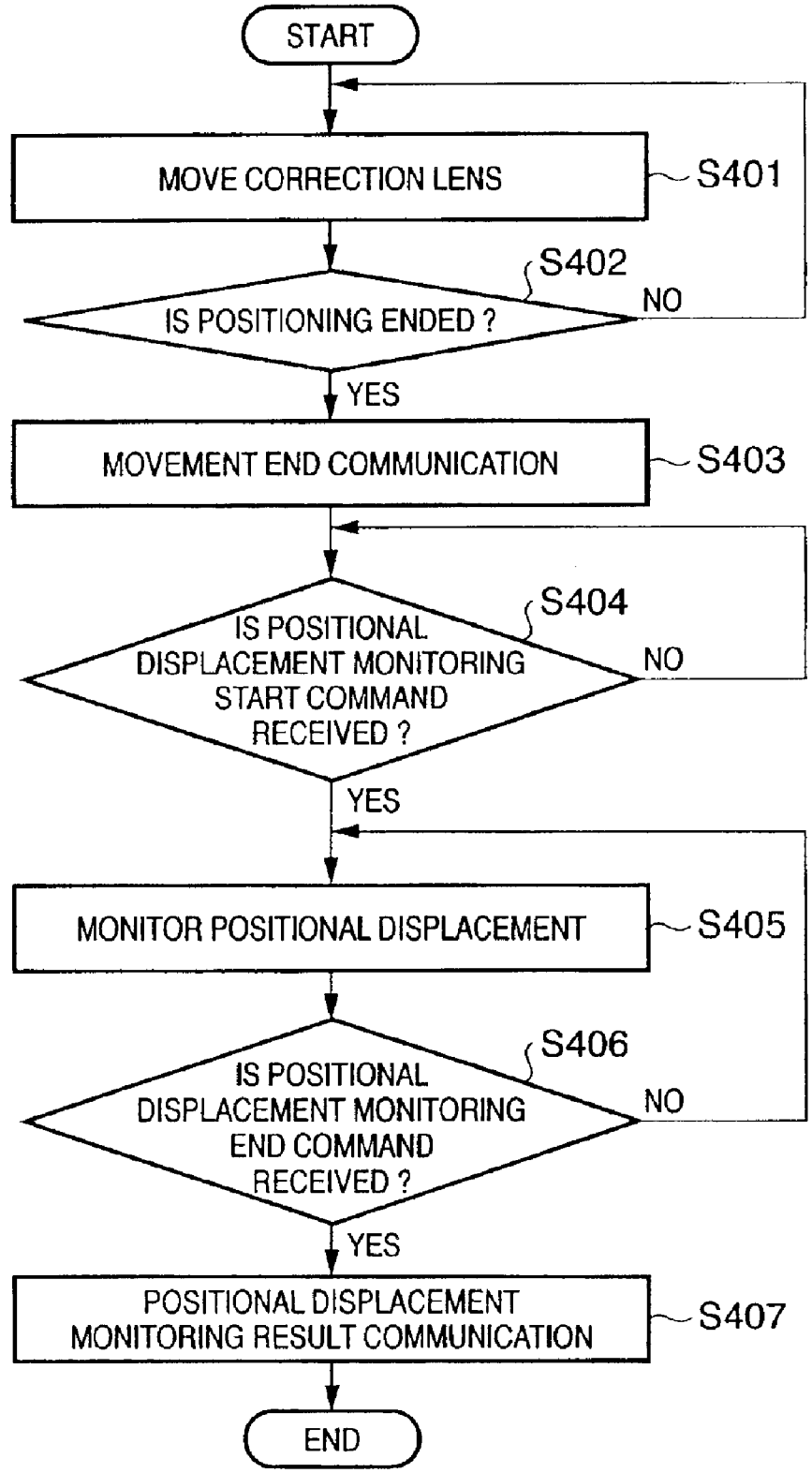
FIG. 4 is a flow chart showing the control operation for a correction lens performed by a projection optical system controller.

In step S401 of FIG. 4, the projection optical system controller 115 controls the correction lens driving systems 113 and 114 in accordance with the received "correction lens driving" command, to start moving the correction lenses 111 and 112. The positions of the correction lenses 111 and 112 are controlled by feedback control. More specifically, the positions of the correction lenses 111 and 112 are controlled by operating the correction lens driving systems 113 and 114 on the basis of the difference between the correction lens driving positions as the position command values (target values) and the current values (control amounts) as outputs from the displacement sensors (not shown), that is, on the basis of position deviations.

In step S402, the projection optical system controller 115 checks whether or not positioning of the correction lenses 111 and 112 is ended. If NO, step S401 is repeated. This determination is made against, e.g., whether the position deviations fall within a predetermined range over a predetermined period of time or more.

When positioning of the correction lenses 111 and 112 is ended, the projection optical system controller 115 sends back "movement end" communication to the correction lens driving system 113 in step S403. The flow then advances to step S404, where the projection optical system controller 115 waits for a "positional displacement monitoring start" instruction.

Upon reception of the "movement end" communication, the main controller 103 sends a "positional displacement monitoring start" command for the correction lenses 111 and 112 to the projection optical system controller 115 in step S305. Subsequently, in step S306, the main controller 103 controls respective related portions, so scan and exposure are performed to transfer the circuit pattern 202 formed on the reticle 109 to a corresponding chip region (shot region) of the wafer 116.

In step S405 of FIG. 4, upon reception of the "lens position displacement monitoring start" command for the correction lenses 111 and 112, the projection optical system controller 115 starts monitoring the positional displacement of the correction lenses 111 and 112. More specifically, the projection optical system controller 115 samples the difference between the target values and the measurement values (control amounts) obtained by displacement sensors (not shown) which measure displacements of the correction lenses 111 and 112, i.e., positional deviations (positional displacement amounts) at predetermined sampling time intervals (e.g., 1 msec). On the basis of the positional deviations, the projection optical system controller 115 operates the correction lens driving systems 113 and 114 which form a feedback control system, and stores the positional deviations. This monitoring of the positional deviations (positional displacement amounts) is continued until the projection optical system controller 115 receives "positional displacement monitoring end" command in step S406.

When scan and exposure are ended, the main controller 103 advances the process to step S307, and sends a "correction lens positional displacement monitoring end" command to the projection optical system controller 115.

Upon reception of the "lens positional displacement monitoring end" command, the projection optical system controller 115 ends positional displacement monitoring, advances to step S407, and analyzes the monitoring result. In this analysis, for example, the projection optical system controller 115 checks whether or not the arithmetic mean of all sampled positional amount displacement amounts exceeds a designated range. The projection optical system controller 115 sends the analysis result to the main controller 103 as a positional displacement monitoring result (e.g., correct or abnormal), and the series of processes shown in FIG. 4 is ended.

In step S308, the main controller 103 receives positional displacement monitoring result (analysis result). If "positional displacement is present (abnormal)" (that is, if pattern exposure is abnormal), the flow advances to step S309. An error message alarming abnormal exposure to the operator is displayed on a display (not shown), and an exposure process is stopped. In this case, other than using a display, an alarm may be produced by utilizing a loudspeaker or the like. In step S310, the main controller 103 waits for restart to be designated by the operator.

As described above, with the exposure apparatus according to the preferred embodiment of the present invention, when the correction lenses 111 and 112 are displaced from their target positions exceeding the allowable ranges, that is, when positional displacement occurs, the operator is notified by an alarm, and the exposure process is stopped. Thus, the operator can immediately perform adjustment or maintenance and inspection of this exposure apparatus on the basis of this alarm, so defective-exposure devices can be minimized. Also, a defective-exposure device can be prevented from being sent to the next step (e.g., a developing step).

When a circuit pattern that requires a comparatively low alignment precision or image-forming precision is to be formed, the operator may restart the operation of the exposure apparatus, so the process is advanced to step S311, and the exposure process can be continued.

In step S308, if it is determined that "no positional displacement is present (correct)", the main controller 103 can advance the process to step S311. The main controller 103 repeats controlling the exposure operation of step S302 to step S311 until exposure is ended for all the chips in the wafer 116.

When exposure is complete for all the chips in the wafer 116, the main controller 103 advances the process to step S312. After that, the wafer 116 for which exposure has been completed is unloaded from the wafer stage 117 by a transport unit. The unloaded wafer is sent to the next step (e.g., a developing step) in a batch of predetermined wafers.

The above process is performed for all the wafers to be processed (step S313).

In the above embodiment, displacement of the correction lenses, which serve to correct magnification and distortion errors of the projection optical system, from the target positions, is monitored. When the displacement exceeds an allowable range, an alarm is produced, and the following operation is stopped. However, the present invention is not limited to this embodiment. For example, the present invention can also be applied to an embodiment as follows. Namely, displacement of the correction lenses, which serve to correct any focusing error and the curvature of field of a projection optical system, from the target positions, is monitored. When the displacement exceeds its allowable range, an alarm is produced, and the following operation is stopped.

Figure 5:
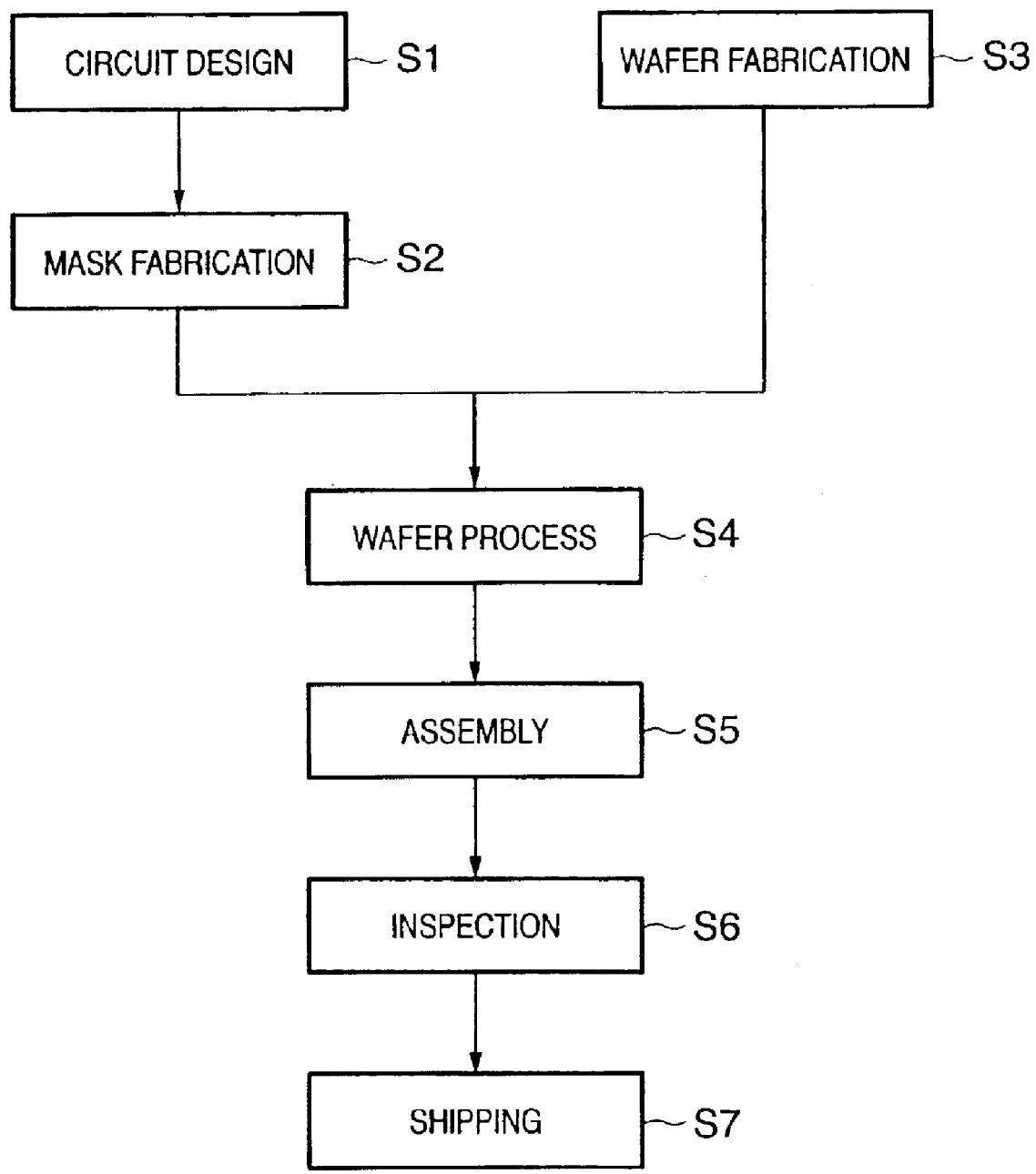
FIG. 5 is a flow chart showing the flow of an overall fabrication process for a semiconductor device.

A semiconductor device fabrication process utilizing the above-described exposure apparatus will be described. FIG. 5 is a flow chart showing the flow of an overall fabrication process for a semiconductor device. In step S1 (circuit design), a circuit design of the semiconductor device is performed. In step S2 (mask fabrication), a mask (reticle or the like) is fabricated on the basis of the designed circuit pattern. On the other hand, in step S3 (wafer fabrication), a wafer is fabricated using a material such as silicon. In step S4 (wafer process), called a preprocess, the above mask and wafer are used, and an actual circuit is formed on the wafer by lithography. In step S5 (assembly), called a postprocess, a semiconductor chip is formed by using the wafer fabricated in step S4. The postprocess includes processing such as an assembly process (dicing and bonding) and a packaging process (chip sealing). In step S6 (inspection), inspections such as an operation test and a durability test are performed on the semiconductor device fabricated in step S5. The semiconductor device is completed through these processes, and is shipped (step S7).

FIG. 6 shows a more detailed flow of the wafer process. In step S11 (oxidation), the surface of the wafer is oxidized. In step S12 (CVD), an insulating film is formed on the surface of the wafer. In step S13 (electrode formation), electrodes are formed by vapor deposition on the wafer. In step S14 (ion implantation), ions are injected into the wafer. In step S15 (resist processing), the wafer is coated with a photoresist. In step S16 (exposure), the above-described exposure apparatus prints the circuit pattern onto the wafer. In this case, the exposure apparatus is controlled as described above. When the control operation of the correction lenses during exposure is abnormal, that is, when pattern printing is abnormal, the exposure apparatus stops operation. In step S17 (development), only wafers on which patterns are printed with no abnormality in step S16 are developed. In step S18 (etching), portions other than the developed resist image are etched. In step S19 (resist stripping), the resist unnecessary after the etching is removed. These steps are repeated, thereby multiple circuit patterns are formed on the wafer.

According to the present invention, for example, when the optical characteristics of the projection optical system during exposure are changed to an unwanted state due to a disturbance or the like, this change can be coped with.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus having a projection optical system for projecting a pattern onto a substrate, said projection optical system including a movable optical element for changing an optical characteristic of said projection optical system, said apparatus comprising:

a driving unit which drives said movable optical element to a target position;

a monitor unit which monitors a positional displacement of said movable optical element from the target position during exposure of the substrate; and a control unit which stops exposure of the substrate based on a monitoring result obtained by said monitor unit.

2. An apparatus according to claim 1, wherein said control unit stops exposure of the substrate if an arithmetic mean of the positional displacement exceeds an allowable range.

3. An apparatus according to claim 1, wherein said control unit restarts the stopped exposure based on a restart instruction.

4. A device manufacturing method comprising steps of:

exposing a substrate to a pattern using an exposure apparatus as recited in claim 1; and developing the exposed substrate.

5. A control method for an exposure apparatus having a projection optical system for projecting a pattern onto a substrate, the projection optical system including a movable optical element for changing an optical characteristic of the projection optical system, said method comprising steps of:

driving the movable optical element to a target position;

monitoring a positional displacement of the movable optical element from the target position during exposure of the substrate; and stopping exposure of the substrate based on a monitoring result obtained in said monitor step.

6. A method according to claim 5, wherein in said stopping step exposure of the substrate is stopped if an arithmetic mean of the positional displacement exceeds an allowable range.

7. A method according to claim 5, further comprising a step of restarting the stopped exposure based on a restart instruction.

8. A method according to claim 5, wherein the optical characteristic to be corrected by the movable optical element comprises at least one of a projection magnification, image distortion, image focus location, and field curvature of the projection optical system.

* * * * *